(12) United States Patent
Nakasendo et al.

(10) Patent No.: US 10,783,923 B2
(45) Date of Patent: Sep. 22, 2020

(54) DATA CODING METHOD AND DATA CODING DEVICE

(71) Applicant: Panasonic Intellectual Property Management Co., Ltd., Osaka (JP)

(72) Inventors: Tsuyoshi Nakasendo, Hyogo (JP); Yasumori Hino, Nara (JP); Kohei Nakata, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 43 days.

(21) Appl. No.: 16/293,735

(22) Filed: Mar. 6, 2019

(65) Prior Publication Data

US 2019/0279680 A1    Sep. 12, 2019

(30) Foreign Application Priority Data

Mar. 8, 2018  (JP) ................. 2018-041486
Dec. 20, 2018  (JP) ................. 2018-238611

(51) Int. Cl.
*G11C 29/00*     (2006.01)
*G11B 20/18*     (2006.01)
*H04L 1/00*      (2006.01)

(52) U.S. Cl.
CPC ........ *G11B 20/1833* (2013.01); *H04L 1/0058* (2013.01)

(58) Field of Classification Search
CPC ...... H03M 5/145; H03M 13/05; H03M 13/31; G11B 20/1833; G11B 20/1426; G11B 27/105; G11B 2220/20; G11B 27/3027; G11B 2220/2587; H04L 1/0058; H04N 5/92; H04N 5/9201; H04N 5/926

See application file for complete search history.

(56) References Cited

U.S. PATENT DOCUMENTS

2009/0015446 A1    1/2009  Coene et al.

FOREIGN PATENT DOCUMENTS

JP        4998472       8/2012

OTHER PUBLICATIONS

Wim Coene et al. "A new d=1, k=10 Soft-Decodable RLL Code with r=2 MTR Constraint and a 2-to-3 PCWA mapping for DC-control", Optical Data Storage 2006:Apr. 23-26, 2006, Montreal, Canada, pp. 168-170.

*Primary Examiner* — Guerrier Merant
(74) *Attorney, Agent, or Firm* — Wenderoth, Lind & Ponack, L.L.P.

(57) ABSTRACT

A data coding device includes an error correction coder that converts user data into ECC data by error correction coding, a modulation coder that converts the ECC data into a series of modulated code data, a detector that detects a local concentration of modulation marks/modulation spaces that are shorter than or equal to a prescribed minimum run-length plus N from the series of modulated code data, a conversion determiner that judges whether to convert the series of modulated code data into another series of modulated code data, according to a concentration, detected by the detector, of the modulation marks/modulation spaces, and a modulation data converter that converts the series of modulated code data into the another series of modulated code data.

18 Claims, 8 Drawing Sheets

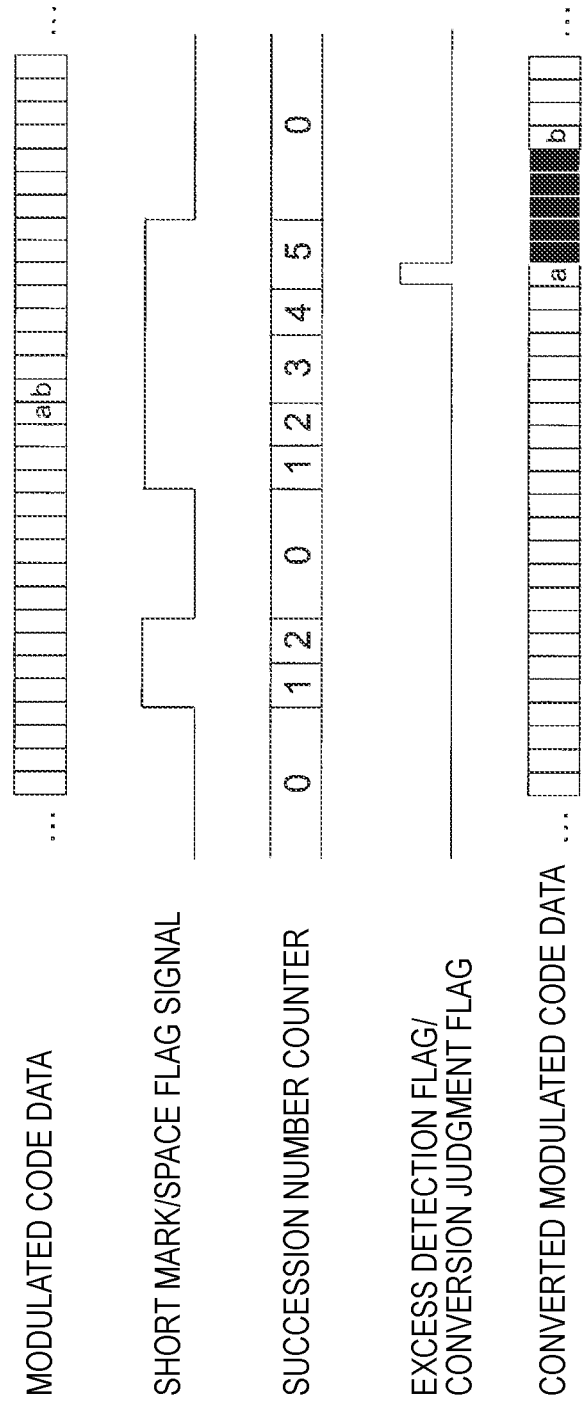

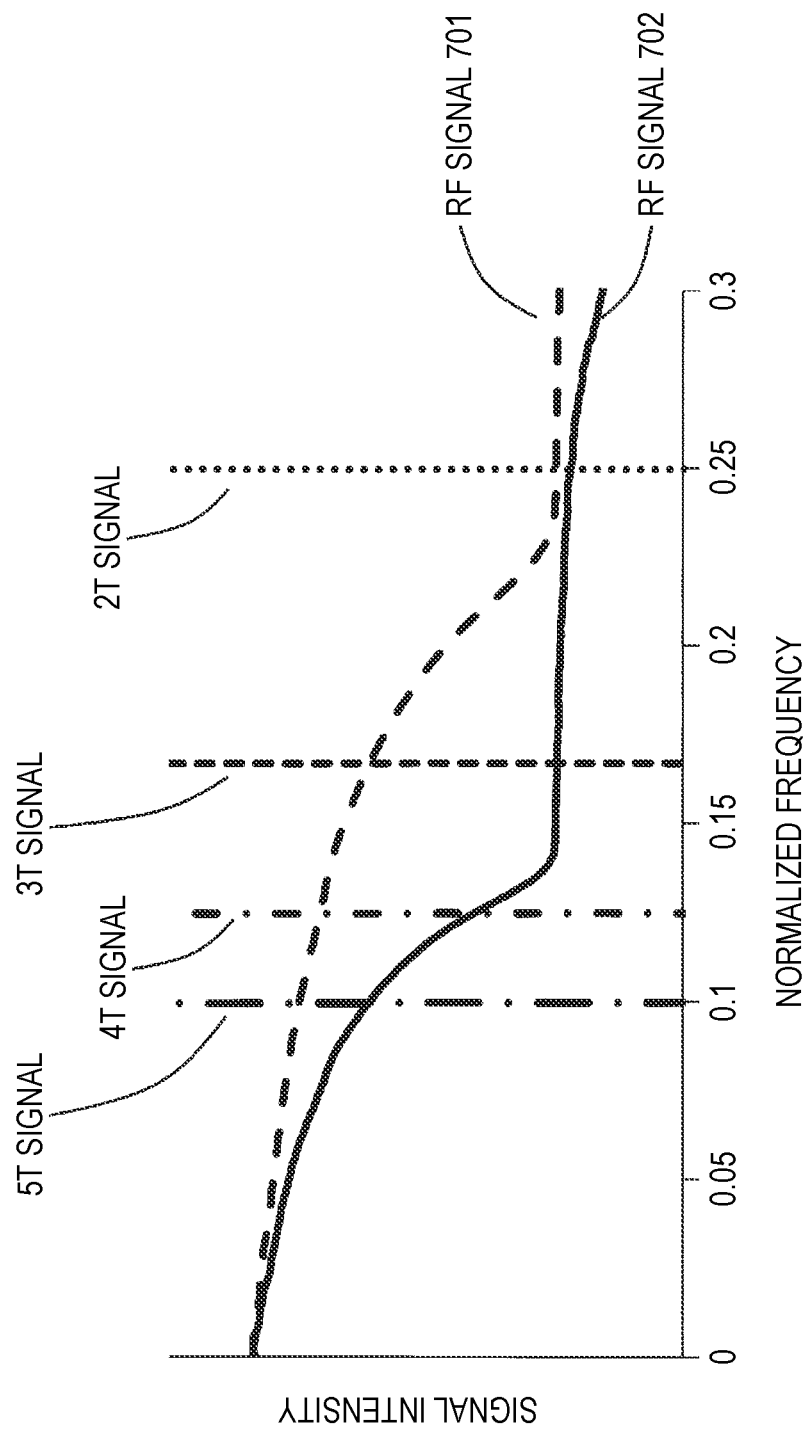

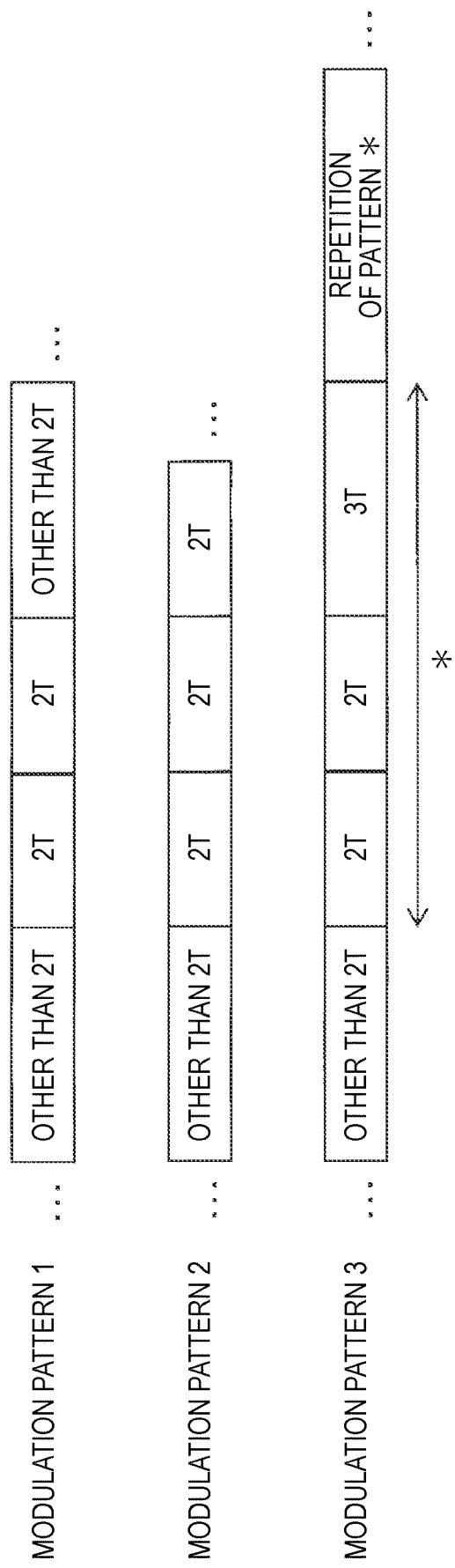

DATA CODING METHOD AND DATA CODING DEVICE

CROSS REFERENCE TO RELATED APPLICATIONS

This application is based on Japanese Patent Application (No. 2018-041486) filed on Mar. 8, 2018 and Japanese Patent Application (No. 2018-238611) filed on Dec. 20, 2018, the contents of which are incorporated herein by reference.

BACKGROUND

1. Field of the Disclosure

The present disclosure relates to a data coding method for converting user data into modulated code data according to a prescribed rule and a data coding device for converting user data into modulated code data according to a prescribed rule.

2. Description of the Related Art

With the recent increase in the capacity of recording media, various kinds of modulated codes suitable for large-capacity media have been proposed.

In recording data on an optical disc, to secure necessary accuracy of detection of a reproduction signal, modulated code data is used that is generated according to a modulation rule that is restricted in code bandwidth so as to conform to the bandwidth restriction of an optical disc reproduction signal.

Among typical constraints on modulated codes are the RLL (run-length limited) constraint and the RMTR (repeated minimum transition run) constraint (also called the MTR constraint). The RLL constraint is a constraint that relates to the minimum number and the maximum number of times of repetition of the same bit (run) in modulated code data and is represented by coefficients d and k. For example, the repetition number d is equal to 1 if the minimum number of consecutive, same modulated bits is 2 and the repetition number k is equal to 7 if the maximum number of is consecutive, same modulated bits is 8.

As for the RLL constraint, in the 17 PP modulated code of the Blu-ray (registered trademark) disc (hereinafter referred to as BD) which is used as movie content distribution media etc., it is known that the minimum modulation pattern is 2 bits (2T mark or space; d=1) and the maximum modulation pattern is 8 bits (8T mark or space; k=7).

The RMTR constraint is a constraint relating to the maximum number of consecutive occurrences of a minimum modulation pattern that is prescribed in the RLL constraint. In the case of the 17 PP modulation code, the maximum number of consecutive occurrences of a minimum modulation pattern is restricted to 6 (r=6). The purpose of the RMTR constraint is to, for example, prevent occurrence of errors during reproduction (refer to JP-B-4998472).

JP-B-4998472 discloses that a PCWA (parity-complementary word assignment) code of r=2 exhibits higher performance in bit detection than a 17 PP code of r=6 under a condition that the track linear density is increased from a value corresponding to 25 GB per layer (the standard disc capacity of the BD) to a value corresponding to 33 to 37 GB per layer. The PCWA is a concept, which is an extension of the parity preservation (PP) principle, means that two user data that are different from each other in parity are kept different from each other in parity even after being converted into modulated codes. A typical PCWA code is a 110 PCWA code that is proposed in Non-patent document 1. This is a PCWA code in which d=1 and k=10 (RLL constraint) and r=2 (RMTR constraint), and is shown to exhibit high bit detection performance in high linear density optical discs.

[Non-patent document 1] "A New d=1, K=10 Soft Decodable RLL Code with r=2 MTR Constraint and a 2 to 3 PCWA Mapping for DC Control," Wim Coene, Andries Hekstra, Bin Yin, Hiroyuki Yamagishi, Makoto Noda, Ariyoshi Nakaoki, Toshihiro Horigome, Optical Data Storage 2006: 23-26 Apr. 2006, Montreal, Canada, pp. 168-170.

However, when the track linear density is increased from a value corresponding to 33 to 37 GB per layer to an even larger value to shorten marks and spaces in the track scanning direction and thereby increase the disc capacity further, it becomes difficult to detect not only marks having a minimum run-length but also relatively short marks whose lengths are close to the minimum run-length depending on the linear density.

FIG. 7 illustrates spectra of optical disc reproduction signals. An RF signal 701 is an example RF signal reproduced from an optical disc having a disc capacity of 33 GB per layer, and an RF signal 702 is an example RF signal reproduced from an optical disc having a disc capacity of 55 GB per layer (about 1.67 times as high in linear density as in the case of the RF signal 701). A flat region (the normalized frequency is higher than about 0.23) of the curve of the RF signal 701 and a flat region (the normalized frequency is higher than about 0.14) of the curve the RF signal 702 represents noise and the remaining region of each curve represents a signal component.

In optical discs, a bandwidth-restricted reproduction signal as obtained by passage through a lowpass filter is obtained because the physical lengths of recording marks and spaces on the disc are short relative to a detection light spot. This characteristic becomes more remarkable as the linear density increases; the frequency (cutoff point) where the noise portion and the signal portion of the curve intersect lowers from about 0.24 (RF signal 701) to 0.14 (RF signal 702). This means that a reproduction signal becomes harder to contain short mark components as the linear density increases. It is seen through comparison with frequencies of single-frequency mark and space signals of 2T to 5T illustrated in FIG. 7 by a dotted line, a broken line, and chain lines, the RF signal 701 does not contain a 2T signal and the RF signal 702 does not contain a 2T signal and a 3T signal as a component(s) outside the signal frequency range.

For the above reason, when the linear density is made even higher than the value corresponding to the disc capacity 33 to 37 GB per layer of JP-B-4998472, it becomes difficult to detect not only marks having the minimum run-length (2T) found in the 17 PP code and the 110 PCWA code but also relatively short marks whose run-lengths (3T to 4T) are close to the minimum run-length. It is easily understood that under this condition it is difficult to prevent detection errors due to short marks and spaces only by an RMTR constraint of r=2.

FIG. 8 illustrates example modulation patterns in which short patterns are concentrated. Modulation pattern-1 illustrated in FIG. 8 is an example that does not violate the 110 PCWA code (RMTR constraint of r=2). Modulation pattern-2 is an example that violates the 110 PCWA code (RMTR constraint of r=2) because a minimum pattern 2T occurs three times consecutively. Such a modulation pattern is not generated from 110 PCWA codes. Modulation pattern-3 in which a set of short patterns 2T, 2T, and 3T is repeated does not violate the 110 PCWA code (RMTR constraint of r=2).

However, for the RF signal 702 illustrated in FIG. 7, a signal component of a repetition of such short patterns is outside a restricted frequency range of an RF signal and it is highly probable that detection errors occur during reproduction. One method for preventing detection errors is to increase the minimum pattern length of the RLL constraint. If the minimum pattern length is changed from d=1 to d=3 (4T), a signal component of the minimum pattern can be included in the frequency range of the RF signal 702 illustrated in FIG. 7. However, since this is a restriction on modulation codes, the coding efficiency is lowered to a large extent. Since this results in reduction of the recordable capacity of user data, further increase of the disc capacity cannot be attained which is the original object.

SUMMARY OF THE INVENTION

The present disclosure provides a data coding method characterized by comprising an error correction coding step of converting user data into error correction codes; a modulation coding step of converting the error correction codes into a series of modulated code data according to a modulation rule that is based on a prescribed conversion constraint and has coding rate that is smaller than 1; a detection step of detecting a local concentration of modulation marks/modulation spaces that are shorter than or equal to a prescribed minimum run-length plus N from the series of modulated code data, N being an integer that is larger than or equal to 0; a conversion judging step of judging whether to convert the series of modulated code data into another series of modulated code data, according to a manner of concentration, detected by the detection step, of the modulation marks/modulation spaces; and a modulation data conversion step of converting the series of modulated code data into another series of modulated code data if the conversion judging step judges that the conversion should be made.

Another aspect of the disclosure provides a data coding device characterized by comprising an error correction coder which converts user data into error correction codes; a modulation coder which converts the error correction codes into a series of modulated code data according to a modulation rule that is based on a prescribed conversion constraint and has coding rate that is smaller than 1; a detector which detects a local concentration of modulation marks/modulation spaces that are shorter than or equal to a prescribed minimum run-length plus N from the series of modulated code data, N being an integer that is larger than or equal to 0; a conversion determiner which judges whether to convert the series of modulated code data into another series of modulated code data, according to a manner of concentration, detected by the detector, of the modulation marks/modulation spaces; and a modulation data converter which converts the series of modulated code data into another series of modulated code data if the conversion determiner judges that the conversion should be made.

In high-density storage recording and reproduction, the data coding method according to the disclosure makes it possible to detect occurrence of an error due to a succession of short patterns or a local concentration of patterns before recording and avoiding its use and to thereby prevent occurrence of an error due to those patterns.

BRIEF DESCRIPTION OF THE DRAWINGS

FIG. 6 is a time chart illustrating an example operation including short mark/space detection and conversion judgment and modulated code data conversion which is performed in the third embodiment.

FIG. 7 are graphs illustrating spectra of reproduction signals from optical discs each of which has a high linear density.

FIG. 8 is diagrams illustrating example modulation patterns in which short patterns are concentrated.

DETAILED DESCRIPTION OF THE EXEMPLARY EMBODIMENTS

Figure 1:
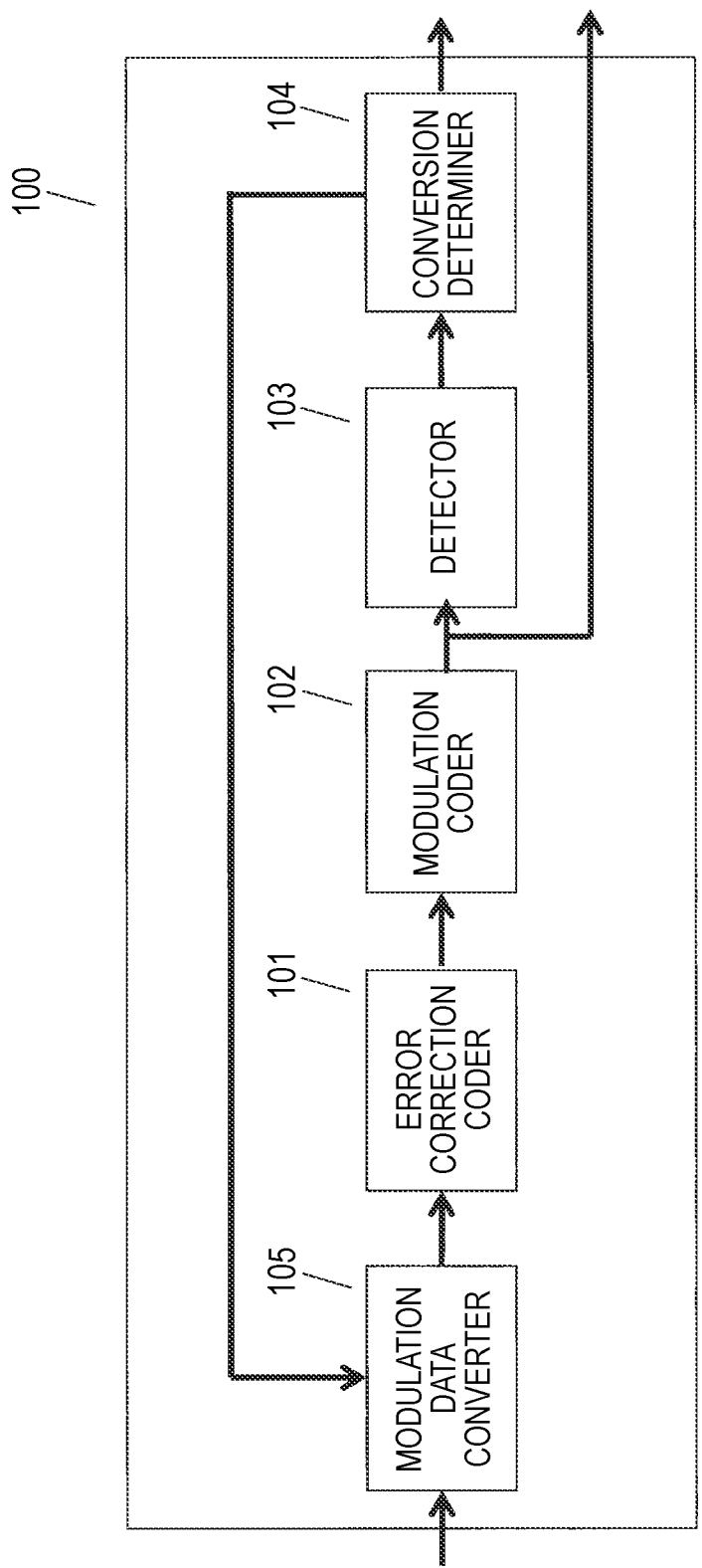
FIG. 1 is a block diagram illustrating an example configuration of a data coding device according to a first embodiment of the present disclosure.

Embodiments of the present disclosure will be hereinafter described while referring to the drawings when necessary. Even if there exists an embodiment that is described in the specification but is not described as corresponding to the invention, this does not necessarily mean that this embodiment does not correspond to the invention. Conversely, even if an embodiment is described in the specification as corresponding to the invention, this does not necessarily mean that this embodiment does not correspond to an invention other than the present disclosure.

Embodiment 1

FIG. 1 is a block diagram illustrating an example configuration of a data coding device 100 according to a first embodiment. The data coding device 100 includes an error correction coder 101, a modulation coder 102, a detector 103, a conversion determiner 104, and a modulation data converter 105.

The ECC coder 101 receives user data and outputs ECC (error correction code) data. The ECC coder 101 generates the ECC data by adding error correction parity to the user data according to a generation matrix for an error correction code that is selected properly to correct errors during reproduction.

The modulation coder 102 receives the ECC data output from the error correction coder 101 and generates modulated code data according to a modulation rule that is based on a prescribed conversion constraint while performing a DC (direct current) control. The modulation coder 102 performs the DC control by inserting DC control (DCC) bits into the ECC data, to suppress a low-frequency variation of modulated codes. The modulation coder 102 generates modulated code data according to the modulation rule that is based on a prescribed conversion constraint and have a coding rate that is smaller than 1 from the ECC data in which the DCC bits are inserted. The modulation rule is selected properly according to a recording/reproduction transmission line characteristic of an optical disc. For example, where the track linear density is higher than a value corresponding to 25 GB per layer that is the BD capacity, a 110 PCWA modulation rule is selected in which the RLL constraint is d=1 and k=10 and the RMTR constraint is r=2.

The detector 103 detects local concentrations of modulation marks/modulation spaces that are shorter than or equal to a prescribed minimum run-length plus N (N: an integer that is larger than or equal to 0) from a series of modulated code data. In this embodiment, consecutive short modulation marks/modulation spaces are detected as an example local concentration of modulation marks/modulation spaces.

Figure 2:
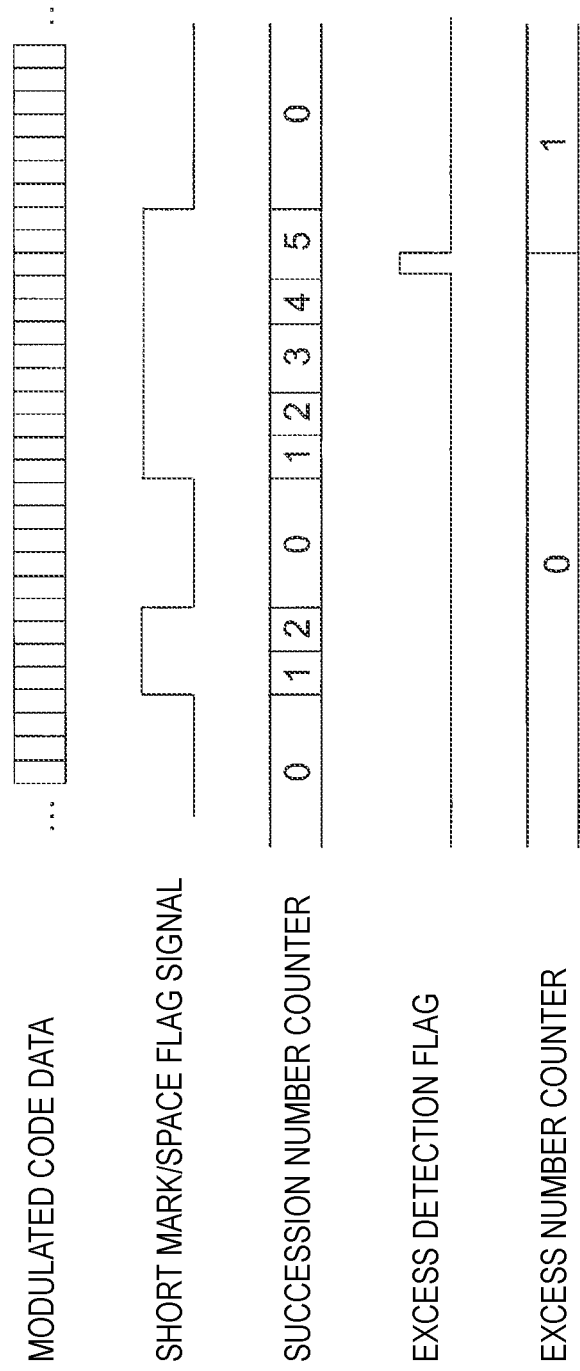
FIG. 2 is a time chart illustrating an example short mark/space detecting operation which is performed by a detector.

FIG. 2 illustrates an example short mark/space detecting operation which is performed by the detector 103. In FIG. 2, modulated code data that is input in synchronism with a channel clock is indicated by one rectangle and corresponds to "0" or "1." The detector 103 detects short modulation marks/modulation spaces that are shorter than or equal to a preset, prescribed minimum run-length plus N (N: an integer that is larger than or equal to 0) from a series of modulated code data and generates a short mark/space flag signal. For example, in the case of modulated codes according to an RLL constraint of d=1, the minimum run-length corresponds to a 2T mark or space. If a setting N=1 is made in advance, shortest marks and spaces detected have a run-length "3." In this case, the short mark/space flag signal becomes active (high in FIG. 2) at positions where 2T or 3T exists.

The detector 103 stores, by means of a succession number counter, a succession number that is counted in units of a mark or space based on the short mark/space flag signal. If the count of the succession number counter exceeds a preset detection succession number, the detector 103 establishes an excess detection flag. In the example of FIG. 2, since the preset detection succession number is "3," the excess detection flag is rendered active when the count of the succession number counter exceeds "3," that is, when it becomes "4." The detector 103 includes an excess number counter for counting the number of times the excess detection flag is rendered active. The detector 103 outputs a count of the excess number counter as detection data which means a detection result of a local concentration of modulation marks/modulation spaces.

Figure 3:
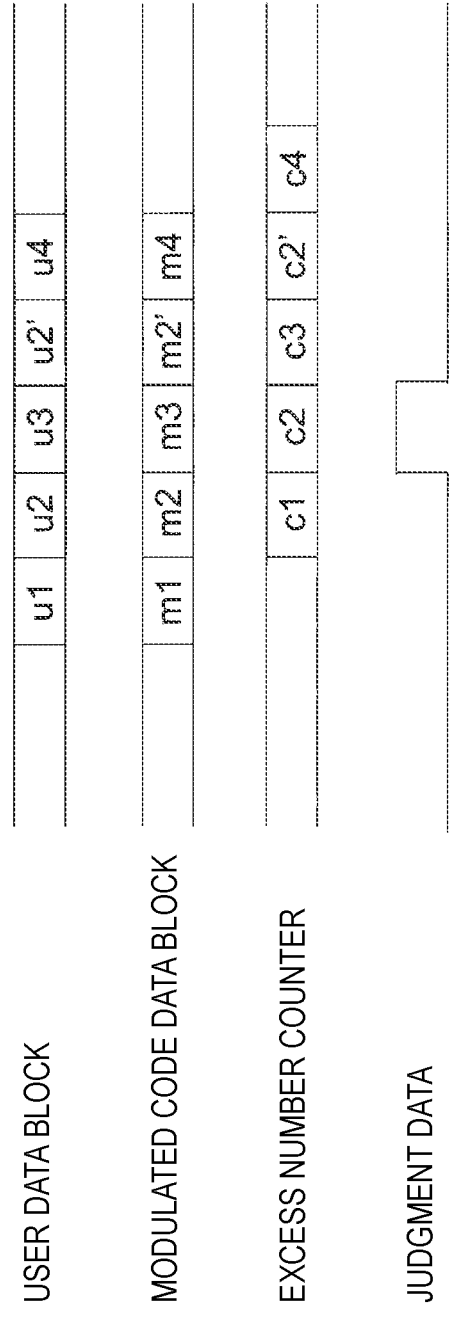
FIG. 3 is a time chart illustrating an example operation including short mark/space detection and conversion judgment and modulated code data conversion.

The conversion determiner 104 judges whether to convert a pattern in which modulation marks/modulation spaces are concentrated locally in the modulated code data on the basis of the received detection data. If the detection data, that is, the count of the excess number counter, exceeds a preset conversion threshold value, the conversion determiner 104 outputs a high judgment data signal as a conversion urging flag. FIG. 3 illustrates an example operation including short mark/space detection and conversion judgment and modulated code data conversion.

For example, as illustrated in FIG. 3, conversion judgment and modulated code data conversion on a block-by-block basis, that is, in units of a prescribed amount of data. For example, one modulated code data block is of 3573498T, 3580776T, 440319T, or 447597T or of T multiplied by some other number. A corresponding modulated code block (mi) is generated from one user data block (ui, i being an integer). Then the detector 103 outputs a count (ci) of the excess number counter as short mark/space detection data of the corresponding modulated code block.

The conversion determiner 104 judges whether to perform block-by-block conversion. FIG. 3 illustrates a case that a count c2 of the excess number counter exceeds a preset conversion threshold value. The conversion determiner 104 outputs a high judgment data signal as a flag for urging conversion of the interval in which the excess number counter holds the count c2 on a block-by-block basis.

The modulation data converter 105 converts, in response to the received conversion urging flag, user data corresponding to the modulated code data block for which the conversion execution judgment has been made into another form by performing bit scrambling using a predetermined random number series on the user data and outputs resulting user data. The converted user data is again subjected to error correction coding and modulation coding and is thereby converted into another piece of modulated code data.

To be able to convert user data into another form, the modulation data converter 105 holds past user data. Alternatively, a system that outputs user data to the device 100 may be the hold past user data and switches the manner of output of the user data to the device 100 according to a conversion urging flag. The random number series consists of fixed values or is generated according to a predetermined rule so that a reproduction device can also use it.

The modulation data converter 105 outputs received user data as it is if the conversion urging flag is inactive. A modulated code data block (m2 in FIG. 3) before conversion is not recorded on a disc or, if it is recorded, the same user data is recorded as a different modulated code data block (m2'). Thus, this modulated code data block is managed properly as a block that need not be reproduced. For example, it is managed as an unreproducible region or a region that need not be reproduced by, for example, a method for managing a defect on a disc as a replaced region.

As described above, this embodiment prevents recording of modulated code data containing a succession of short modulation marks/modulation spaces that are shorter than or equal to a prescribed minimum run-length plus N (N: an integer that is larger than or equal to 0). A low-probability event that short modulation patterns occur successively can be prevented by properly setting, in advance, the above-described parameters, that is, the prescribed detection run-length, the detection succession number, and the conversion threshold value. Occurrence of detection errors during reproduction can be prevented by imposing a constraint that is extended from the conventional RMTR constraint while making reduction in modulation coding rate as small as possible.

Embodiment 2

The configuration and operation of a data coding device according to a second embodiment will be described below. The same portions of the configuration and operation as in the first embodiment will not be described, that is, only differences will be described.

Figure 4:
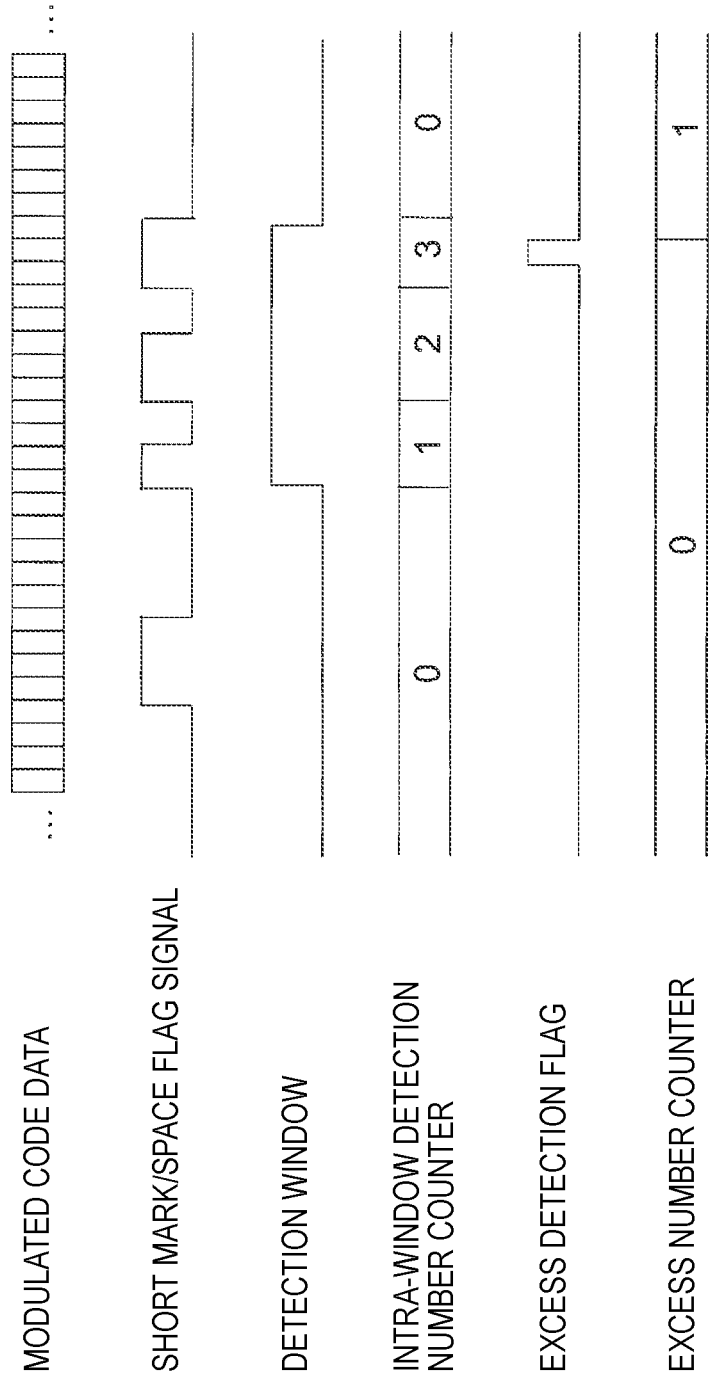
FIG. 4 is a time chart illustrating an example short mark/space detecting operation which is performed by the detector employed in a second embodiment of the disclosure.

FIG. 4 illustrates an example short mark/space detecting operation which is performed by a detector 103 employed in the second embodiment.

In this embodiment, the number of short modulation marks/modulation spaces in a prescribed interval is detected as a local concentration of modulation marks/modulation spaces that are shorter than or equal to a prescribed minimum run-length plus N (N: an integer that is larger than or equal to 0).

The second embodiment is different from the first embodiment in that a detection window is newly introduced. A modulated code data series is scanned from the head using a detection window having a prescribed interval. The detector 103 stores, in an intra-window detection number counter, the number of short marks/spaces in the detection window.

If the count of the intra-window detection number counter exceeds a predetermined intra-window detection number, the detector 103 establishes an excess detection flag. The subsequent operation is the same as in the first embodiment. In this embodiment, a local concentration of modulation patterns can be detected instead of a succession of short modulation patterns and more patterns can be detected than in the first embodiment, whereby modulated code data can be formed according to a constraint that is extended even further. Detection errors during reproduction can thus be prevented.

Embodiment 3

The configuration and operation of a data coding device 500 according to a third embodiment will be described below. The same portions of the configuration and operation as in the first embodiment will not be described, that is, only differences will be described.

Figure 5:
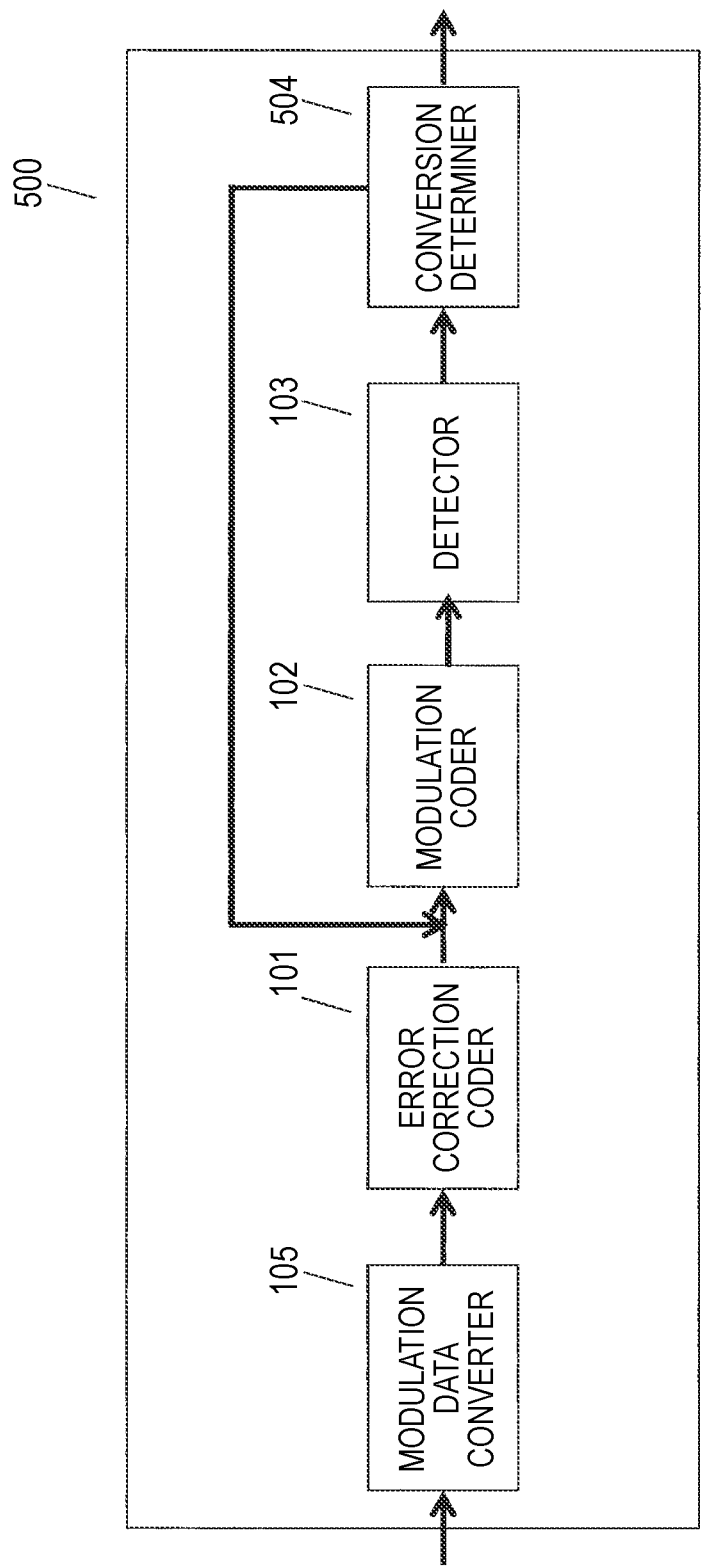
FIG. 5 is a block diagram illustrating an example configuration of a data coding device according to a third embodiment of the disclosure.

FIG. 5 is a block diagram illustrating an example configuration of a data coding device 500 according to the third embodiment. FIG. 6 illustrates an essential operation of a conversion determiner 504 illustrated in FIG. 5. The detector 103 illustrated in FIG. 5 holds, by means of a succession number counter, a succession number that is counted in units of a mark or space. When the conversion determiner 504 has output the succession number as detection data, the conversion determiner 504 inserts a modulated code pattern having a predetermined fixed length into the succession of the short marks/spaces of the modulated code data to prevent occurrence of a local concentration of short marks/spaces of the modulated code data.

If a preset detection succession number is exceeded (i.e., if the detector 103 has established an excess detection flag and output it as a conversion judgment flag), the conversion determiner 504 illustrated in FIG. 5 inserts a modulated code pattern having a predetermined fixed length into the succession of the short marks/spaces of the modulated code data in synchronism with the received conversion judgment flag. In FIG. 6, a modulated code pattern having the predetermined fixed length that is inserted in converted modulated code data is indicated by black rectangles. As illustrated in FIG. 6, data a and b immediately before and after the inserted modulated code pattern are included in an interval of a succession of short marks/spaces of an original modulated code data series and adjoin a mark/space boundary.

The data coding device 500 according to this embodiment may be configured in such a manner that a modulated code pattern having a predetermined fixed length is inserted into a local concentration of marks/spaces detected using a detection window illustrated in FIG. 4. In this case, data a and b immediately before and after the inserted modulated code pattern are included in a pattern that corresponds to an excess detection flag and is included in the detection window.

This embodiment makes it possible to prevent a succession of short modulation patters and a local concentration of modulation patterns that may occur at a low probability and to thereby impose a constraint that is extended from the conventional RMTR constraint while making reduction in modulation coding rate as small as possible. As a result, occurrence of a detection error during reproduction due to a succession short mark/spaces or a concentration of mark/spaces can be prevented.

The data coding method according to the present disclosure can be applied to optical disc devices which record and reproduce data.

What is claimed is:

1. A data coding method comprising:
   converting user data into ECC data by error correction coding;
   converting the ECC data into a series of modulated code data according to a modulation rule that is based on a prescribed conversion constraint and has coding rate that is smaller than 1;
   detecting a local concentration of modulation marks/modulation spaces that are shorter than or equal to a prescribed minimum run-length plus N from the series of modulated code data, N being an integer that is larger than or equal to 0;
   judging whether to convert the series of modulated code data into another series of modulated code data, according to a concentration, detected by the detection step, of the modulation marks/modulation spaces; and
   converting the series of modulated code data into the another series of modulated code data if the conversion judging step judges that the series of modulated code data should be converted into the another series of modulated code data.

2. The data coding method according to claim 1, wherein in the detection step, a local concentration of modulation marks/modulation spaces is detected by counting the number of successions of short modulation marks/modulation spaces that are shorter than or equal to the prescribed minimum run-length plus N from a head of the series of modulated code data, and counting an excess number if the counted number of successions exceeds a predetermined upper limit count.

3. The data coding method according to claim 1, wherein in the detection step, a local concentration of modulation marks/modulation spaces is detected by scanning the series of modulated code data from its head using a detection window having a predetermined length, counting the number of successions of short modulation marks/modulation spaces that are shorter than or equal to the prescribed minimum run-length plus N and are included in the detection window, and counting an excess number if the number of successions exceeds a predetermined upper limit count.

4. The data coding method according to claim 2, wherein in the conversion judging step, it is judged that the series of modulated code data should be converted into the another series of modulated code data if the counted excess number is larger than a predetermined judgment upper limit.

5. The data coding method according to claim 3, wherein in the conversion judging step, it is judged that the series of modulated code data should be converted into the another series of modulated code data if the counted excess number is larger than a predetermined judgment upper limit.

6. The data coding method according to claim 4, wherein if a local concentration of modulation marks/modulation spaces is detected in modulated code data having a predetermined length by the detection step and it is judged that the modulated code data having the predetermined length should be converted into the another series of modulated code data by the conversion judging step, the modulated code data having the predetermined length is converted into another series of modulated code data by performing bit scrambling using a predetermined random number series on pre-conversion user data corresponding to the modulated code data having the predetermined length and performing error correction coding and modulating coding on the bit-scrambled user data in the conversion step.

7. The data coding method according to claim 5, wherein if a local concentration of modulation marks/modulation spaces is detected in modulated code data having a predetermined length by the detection step and it is judged that the modulated code data having the predetermined length should be converted into the another series of modulated code data by the conversion judging step, the modulated code data having the predetermined length is converted into another series of modulated code data by performing bit scrambling using a predetermined random number series on pre-conversion user data corresponding to the modulated code data having the predetermined length and performing error correction coding and modulating coding on the bit-scrambled user data in the conversion step.

8. The data coding method according to claim 1, wherein in the detection step, a local concentration of modulation marks/modulation spaces is detected by counting the number of successions of short modulation marks/modulation spaces that are shorter than or equal to the prescribed minimum run-length plus N from the head of the series of modulated code data; and
wherein in the conversion judging step, it is judged that the series of modulated code data is converted into another series of modulated code data if the counted number of successions exceeds a predetermined upper limit count and, when it is judged that the conversion should be made, a modulation pattern that is longer than the prescribed minimum run-length plus N is inserted into a successive pattern concerned of short modulation marks/modulation spaces.

9. The data coding method according to claim 1, wherein in the detection step, a local concentration of modulation marks/modulation spaces is detected by scanning the series of modulated code data from its head using a detection window having a predetermined length and counting the number of successions of short modulation marks/modulation spaces that are shorter than or equal to the prescribed minimum run-length plus N and are included in the detection window; and
wherein in the conversion judging step, it is judged that the series of modulated code data should be converted into another series of modulated code data if the counted number of successions exceeds a predetermined upper limit count and, when it is judged that the conversion should be made, a modulation pattern that is longer than the prescribed minimum run-length plus N is inserted into a successive pattern concerned of short modulation marks/modulation spaces.

10. A data coding device comprising:
an error correction coder configured to convert user data into ECC data by error correction coding;
a modulation coder configured to convert the ECC data into a series of modulated code data according to a modulation rule that is based on a prescribed conversion constraint and has coding rate that is smaller than 1;
a detector configured to detect a local concentration of modulation marks/modulation spaces that are shorter than or equal to a prescribed minimum run-length plus N from the series of modulated code data, N being an integer that is larger than or equal to 0;
a conversion determiner configured to judge whether to convert the series of modulated code data into another series of modulated code data, according to a concentration, detected by the detector, of the modulation marks/modulation spaces; and
a modulation data converter configured to convert the series of modulated code data into the another series of modulated code data if the conversion determiner judges that the series of modulated code data should be converted into the another series of modulated code data.

11. The data coding device according to claim 10, wherein the detector detects a local concentration of modulation marks/modulation spaces by counting the number of successions of short modulation marks/modulation spaces that are shorter than or equal to the prescribed minimum run-length plus N from a head of the series of modulated code data, and counting an excess number if the counted number of successions exceeds a predetermined upper limit count.

12. The data coding device according to claim 10, wherein the detector detects a local concentration of modulation marks/modulation spaces by scanning the series of modulated code data from its head using a detection window having a predetermined length, counting the number of successions of short modulation marks/modulation spaces that are shorter than or equal to the prescribed minimum run-length plus N and are included in the detection window, and counting an excess number if the number of successions exceeds a predetermined upper limit count.

13. The data coding device according to claim 11, wherein the conversion determiner judges that the series of modulated code data should be converted into the another series of modulated code data if the counted excess number is larger than a predetermined judgment upper limit.

14. The data coding device according to claim 12, wherein the conversion determiner judges that the series of modulated code data should be converted into the another series of modulated code data if the counted excess number is larger than a predetermined judgment upper limit.

15. The data coding device according to claim 13, wherein if the detector detects a local concentration of modulation marks/modulation spaces in modulated code data having a predetermined length and the conversion determiner judges that the modulated code data having the predetermined length should be converted into the another series of modulated code data, the modulation data converter converts the modulated code data having the predetermined length into another series of modulated code data by performing bit scrambling using a predetermined random number series on pre-conversion user data corresponding to the modulated code data having the predetermined length and performing error correction coding and modulating coding on the bit-scrambled user data.

16. The data coding device according to claim 14, wherein if the detector detects a local concentration of modulation marks/modulation spaces in modulated code data having a predetermined length and the conversion determiner judges that the modulated code data having the predetermined length should be converted into the another series of modulated code data, the modulation data converter converts the modulated code data having the predetermined length into another series of modulated code data by performing bit scrambling using a predetermined random number series on pre-conversion user data corresponding to the modulated code data having the predetermined length and performing error correction coding and modulating coding on the bit-scrambled user data.

17. The data coding device according to claim 10, wherein the detector detects a local concentration of modulation marks/modulation spaces by counting the number of successions of short modulation marks/modulation spaces that are shorter than or equal to the prescribed minimum run-length plus N from the head of the series of modulated code data; and wherein the conversion determiner judges that the series of modulated code data should be converted into the another series of modulated code data if the counted number of successions exceeds a predetermined upper limit count and, when it is judged that the conversion should be made, the conversion determiner inserts a modulation pattern that is longer than the prescribed minimum run-length plus N into a successive pattern concerned of short modulation marks/modulation spaces.

18. The data coding device according to claim 10, wherein the detector detects a local concentration of modulation marks/modulation spaces by scanning the series of modulated code data from its head using a detection window having a predetermined length and counting the number of successions of short modulation marks/modulation spaces that are shorter than or equal to the prescribed minimum run-length plus N and are included in the detection window; and wherein the conversion determiner judges that the series of modulated code data should be converted into another series of modulated code data if the counted number of successions exceeds a predetermined upper limit count and, when it is judged that the conversion should be made, a modulation pattern that is longer than the prescribed minimum run-length plus N is inserted into a successive pattern concerned of short modulation marks/modulation spaces.

\* \* \* \* \*